(12) United States Patent
Holland

(10) Patent No.: US 6,259,085 B1
(45) Date of Patent: Jul. 10, 2001

(54) FULLY DEPLETED BACK ILLUMINATED CCD

(75) Inventor: Stephen Edward Holland, Hercules, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/504,315

(22) Filed: Feb. 15, 2000

Related U.S. Application Data

(63) Continuation-in-part of application No. 08/961,868, filed on Oct. 31, 1997, now Pat. No. 6,025,585.
(60) Provisional application No. 60/030,415, filed on Nov. 1, 1996.

(51) Int. Cl.[7] .......................... H01S 40/14; H01L 27/148

(52) U.S. Cl. ................................. 250/208.1; 250/214.1; 257/447; 257/460

(58) Field of Search .......................... 250/214.1, 214 R, 250/208.1, 208.2, 332, 370.01, 370.08, 370.09, 370.12, 370.13; 257/431, 432, 441, 442, 446, 447, 448, 457, 460, 466, 184, 188, 189; 438/60, 66, 73, 94, 97, 108, 209, 535, 928

(56) References Cited

U.S. PATENT DOCUMENTS

| | | | |
|---|---|---|---|
| 4,570,329 | * | 2/1986 | Paine et al. ............................. 438/66 |
| 4,695,861 | * | 9/1987 | Paine et al. ............................ 257/442 |
| 5,189,297 | * | 2/1993 | Ahlgren ............................. 250/214.1 |
| 5,494,833 | * | 2/1996 | Martin et al. ........................... 438/66 |
| 5,541,438 | * | 7/1996 | Martin et al. ......................... 257/447 |
| 5,940,685 | * | 8/1999 | Loomis et al. .......................... 438/60 |
| 6,025,585 | * | 2/2000 | Holland ............................. 250/208.1 |

* cited by examiner

Primary Examiner—John R. Lee
(74) Attorney, Agent, or Firm—Henry P. Sartorio

(57) ABSTRACT

A backside illuminated charge coupled device (CCD) is formed of a relatively thick high resistivity photon sensitive silicon substrate, with frontside electronic circuitry, and an optically transparent backside ohmic contact for applying a backside voltage which is at least sufficient to substantially fully deplete the substrate. A greater bias voltage which overdepletes the substrate may also be applied. One way of applying the bias voltage to the substrate is by physically connecting the voltage source to the ohmic contact. An alternate way of applying the bias voltage to the substrate is to physically connect the voltage source to the frontside of the substrate, at a point outside the depletion region. Thus both frontside and backside contacts can be used for backside biasing to fully deplete the substrate. Also, high resistivity gaps around the CCD channels and electrically floating channel stop regions can be provided in the CCD array around the CCD channels. The CCD array forms an imaging sensor useful in astronomy.

16 Claims, 3 Drawing Sheets

FULLY DEPLETED BACK ILLUMINATED CCD

RELATED APPLICATIONS

This application is a continuation-in-part (CIP) of Ser. No. 08/961,868 filed Oct. 31, 1997, now U.S. Pat. No. 6,025,585 issued Feb. 15, 2000, which is herein incorporated by reference, and which claims priority of Provisional Application Ser. No. 60/030,415 filed Nov. 1, 1996.

Government Rights

The United States Government has rights in this invention pursuant to Contract No. DE-AC03-76SF00098 between the United States Department of Energy and the University of California.

BACKGROUND OF THE INVENTION

The invention relates generally to charge coupled devices (CCDs), and more particularly to back illuminated CCDs.

Charge coupled devices (CCDs), which were originally developed as computer memory, are widely used as imaging detectors, in fields ranging from astronomy to medicine. Incident light is converted to electronic charge in a CCD; the charge is collected in potential wells, transferred out, detected, and stored. Images are then produced from the stored data. In a CCD, the electronic circuitry and gates are formed on one side of a silicon wafer, the frontside; the other side of the wafer is the backside.

When illuminated on the frontside, absorption of incident light by the electronic circuitry reduces quantum efficiency. As an alternative, CCDs can be illuminated from the backside; however, backside illumination produces other problems. When the incident photons enter the silicon wafer, they are absorbed and produce electronic charge by the photoelectric effect. The wafer thickness must be sufficient to allow charge generation, and a depletion region should exist to transport the charge to the collecting channels. For conventional low resistivity substrates the thickness of the depletion region is limited to less than about 10 $\mu$m. Therefore, for good blue and ultraviolet response, the substrate must be extremely thin, resulting in a very fragile and expensive structure.

Therefore, a backside illuminated CCD is desired which has a thick substrate, and which has a high quantum efficiency over a broad range of wavelengths, from infrared and red to blue and ultraviolet. The CCD should be relatively simple and inexpensive to manufacture. It is desired to have a backside illuminated CCD imaging system for use in astronomy.

SUMMARY OF THE INVENTION

Accordingly it is an object of the invention to provide an improved backside illuminated CCD.

It is another object of the invention to provide a backside illuminated CCD which has a high quantum efficiency over a broad range of wavelengths.

It is also an object of the invention to provide a backside illuminted CCD which is useful for astronomical imaging applications.

The invention is a backside illuminated charge coupled device (CCD) formed of a relatively thick high resistivity photon sensitive silicon substrate, with frontside electronic circuitry, and an optically transparent backside ohmic contact for applying a backside voltage which is at least sufficient to substantially fully deplete the substrate. A bias voltage which overdepletes the substrate may also be applied. One way of applying the bias voltage to the substrate is by physically connecting the voltage source to the ohmic contact. An alternate way of applying the bias voltage to the substrate is to physically connect the voltage source to the frontside of the substrate, at a point outside the depletion region. Thus both frontside and backside contacts can be used for backside biasing to fully deplete the substrate. Also, high resistivity gaps around the CCD channels and electrically floating channel stop regions can be provided in the CCD array. The CCD array forms an imaging sensor useful in astronomy.

DETAILED DESCRIPTION OF THE INVENTION

The invention is an improved charge coupled device (CCD) which is fully depleted and back illuminated. The CCDs of the invention are fabricated on relatively thick, e.g. 300 $\mu$m, high resistivity, e.g. 10,000$\Omega$cm, silicon substrate. The CCD circuitry and gates are formed on the frontside of the substrate and a very thin, e.g. 10 $\mu$m, ohmic contact on the backside. The ohmic contact layer is transparent to long and short wavelength photons, i.e. from infrared and red to blue and ultraviolet. The CCDs are preferably p-channel CCDs on n-type substrates. The CCDs of the invention are used in an imaging array, e.g. arrays of 200×200 or 2048× 2048 pixels with a pixel size of 15 $\mu$m×15 $\mu$m.

The basic features of the CCD of the invention are described in U.S. patent application Ser. No. 08/961,868 filed Oct. 31, 1997, now U.S. Pat. No. 6,025,585 issued Feb. 15, 2000, which is herein incorporated by reference.

The ohmic contact backside layer is electrically conducting, i.e. has low resistivity, and is typically made of doped polycrystalline silicon, e.g. phosphorus doped. The ohmic contact layer may also be made of any other electrically conducting material, and will have the same type conductivity as the substrate, i.e. n-type for the preferred n-type substrate. The ohmic contact layer thickness is generally in the range of about 10 nm to about 1 $\mu$m, and must be optically transparent to the radiation being detected.

The substrate is preferably n-type silicon, although conventional CCDs are almost always made on p-type silicon. The substrate is a photosensitive material which generates charge from incident photons through the photoelectric effect. The substrate may have a thickness of about 100 $\mu$m to about 1 mm, and a resistivity of about 1 k$\omega$-cm to about 20 k$\omega$-cm. Typical silicon wafers with thicknesses of about 200 $\mu$m to about 600 $\mu$m can be used.

In operation, the conducting backside layer allows a backside bias voltage to be applied across the substrate to fully deplete the substrate in a depletion region extending the full substrate thickness below each CCD pixel. The voltage applied must be at least sufficient to fully deplete the substrate, although it may be higher and overdeplete the substrate. A typical voltage is about 30–80 V, which is still relatively low but significantly higher than used in conventional CCDs. The backside bias voltage, or substrate voltage Vsub, may be applied through an electrical contact attached to the backside ohmic contact layer or it may be applied to a contact attached to the frontside.

Figure 1:
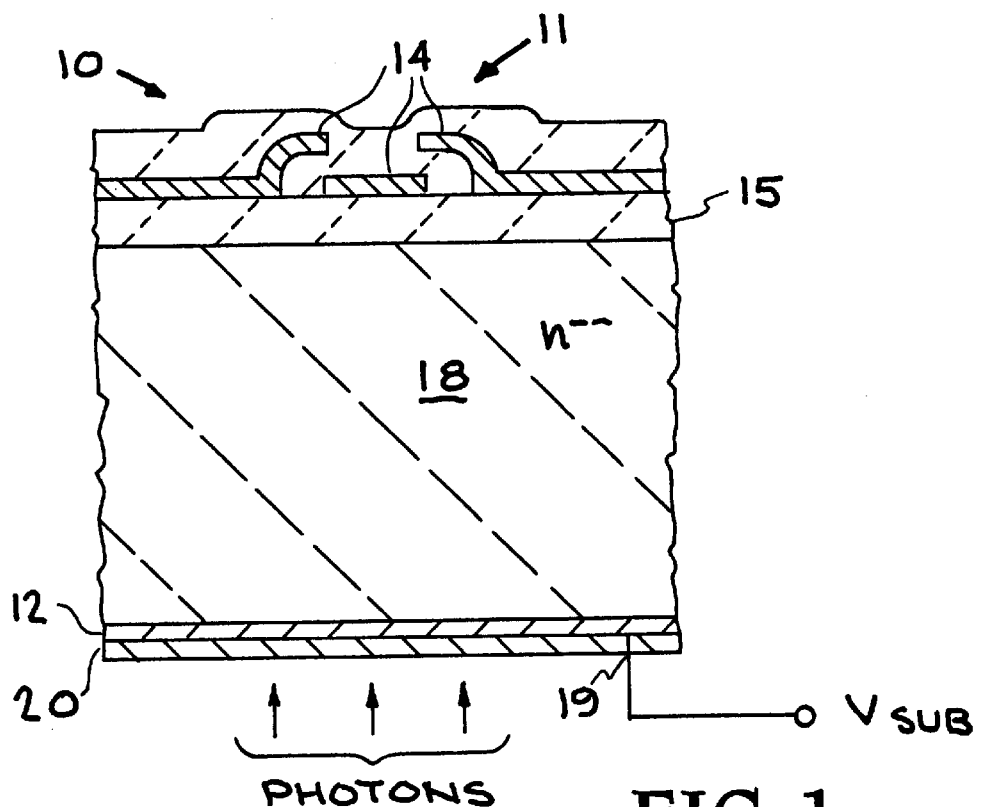
FIG. 1 is a cross-sectional view of a backside illuminated CCD structure of the invention with bias voltage applied to the backside ohmic contact.

As illustrated in FIG. 1, a charge coupled device (CCD) pixel 10 of the invention is formed on a substrate 18 which preferably has a conductivity n⁻. A buried p channel 15 is formed on the frontside of substrate 18. Channel 15 collects charge carriers produced in the substrate 18 by absorption of incident photons. The CCD structure 11, which includes gate electrodes 14 which are typically made of polysilicon, is formed over the channel 15 and is used to transfer the collected charge.

Transparent ohmic contact window layer 12 is formed on the backside of substrate 18. An optional antireflection (AR) layer 20 may be deposited on top of the backside layer 12. Layer 12 is conducting, e.g. doped polycrystalline silicon. Antireflection layer 20 may also be conducting, e.g. indium tin oxide (ITO).

Backside full depletion voltage Vsub is applied between layer 12 and CCD circuit structure 11 across substrate 18 through an electrical contact 19 which is attached to layer 12 (or layer 20 if layer 20 is conductive). Vsub is sufficient to at least fully deplete, or to overdeplete, charge carriers from the substrate 18 across its full thickness.

However, making a physical connection of Vsub to layer 12 has several drawbacks. Typically a pad must be epoxied to layer 12, taking valuable space. A small wire can be directly connected but it is fragile. Furthermore, some AR layers 20 are not conducting, e.g. multilayer insulator coatings, making electrical contact more difficult. A technique which allows biasing of the backside conducting layer 12 without requiring physical contact to the backside eliminates these problems.

Figure 2A:
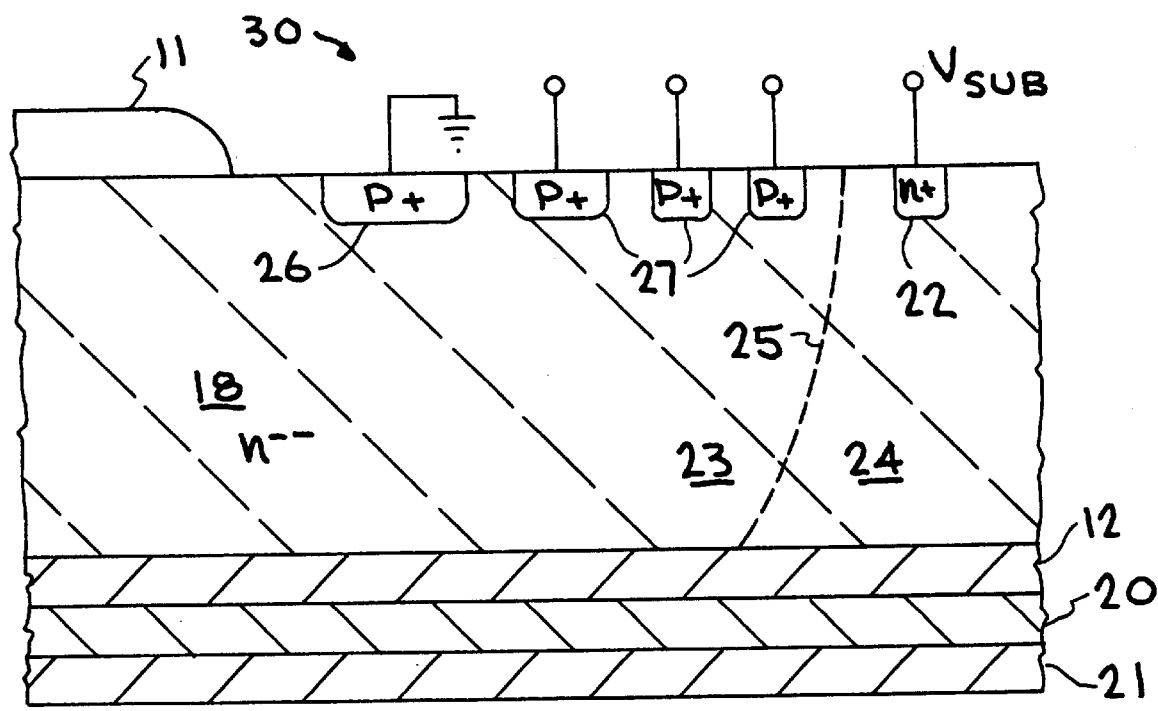
FIG. 2A is a cross-sectional view of a backside illuminated CCD structure of the invention with bias voltage applied to a frontside contact.

An alternate configuration of a CCD pixel 30 with frontside bias voltage contact is shown in FIG. 2A. CCD pixel 30 has CCD circuitry II formed on the frontside of n⁻ substrate 18 with n⁺ backside layer 12 and ITO AR layer 20 on the backside. An insulator layer 21 made of SiO₂ or other insulator is formed on AR layer 20. Vsub is applied to an n⁺substrate contact 22 formed in the frontside surface of substrate 18. When Vsub is applied between contact 22 and grounded p⁺guard ring 26 on the frontside, substrate 18 is divided into two regions, depleted region 23 and undepleted region 24 which are separated by depletion edge 25. Contact 22 is located outside depletion region 23, and may be a single contact or a ring.

Neglecting dark and signal current, the undepleted n-type region 24 is an equipotential and extends from frontside contact 22 biased at Vsub to backside conductive layers 12, 20. Since in this idealized case, no current is flowing, the backside is therefore also biased at Vsub.

Figure 2B:
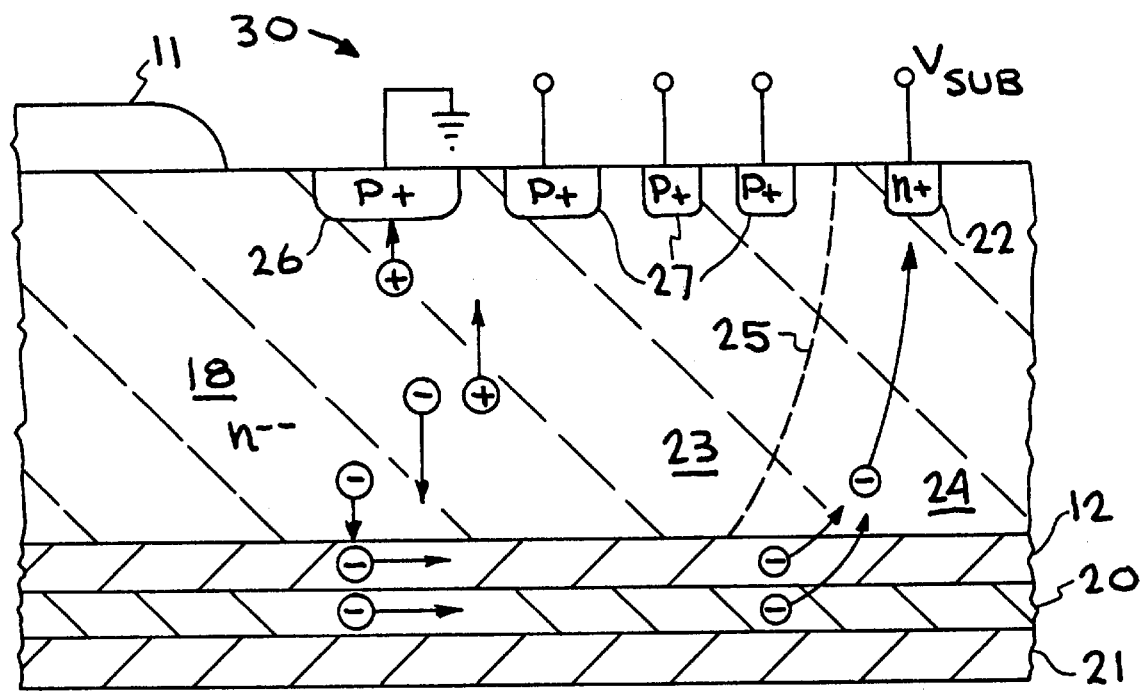
FIG. 2B is cross-sectional view of a backside illuminated CCD structure FIG. 2A showing the charge carrier motion in the structure.

In actuality, both dark current and signal current are present. Electrons generated by photon absorption in the substrate flow into the backside conducting layer 12 due to the electric field generated by the backside bias voltage. In the case of the backside connection of FIG. 1, the electrons are sunk by the external bias supply. However, in the case of the frontside connection of FIG. 2A, the electrons must travel along conducting layers 12, 20 to undepleted region 24 and to frontside contact 22, as shown in FIG. 2B. An ohmic voltage drop could result across the backside layers 12, 20 if current flow is too large, resulting in a backside voltage lower than Vsub. However, at least for low light imaging as in astronomy, both dark current and signal current are low.

Floating p⁺ guard rings 27 are formed on the frontside of substrate 18 between Vsub frontside contact 22 and grounded p⁺ guard ring 26. Guard rings 27 are used to drop the voltage from Vsub to grounded guard ring 26 in well controlled steps. Grounded guard ring 26 encloses the CCD circuitry 11. The use of floating guard rings improves junction breakdown voltage and reduces the dependence of the electric fields on charges that may be present at the silicon-silicon dioxide interface, or on the insulting layer above the silicon substrate.

Figure 3:
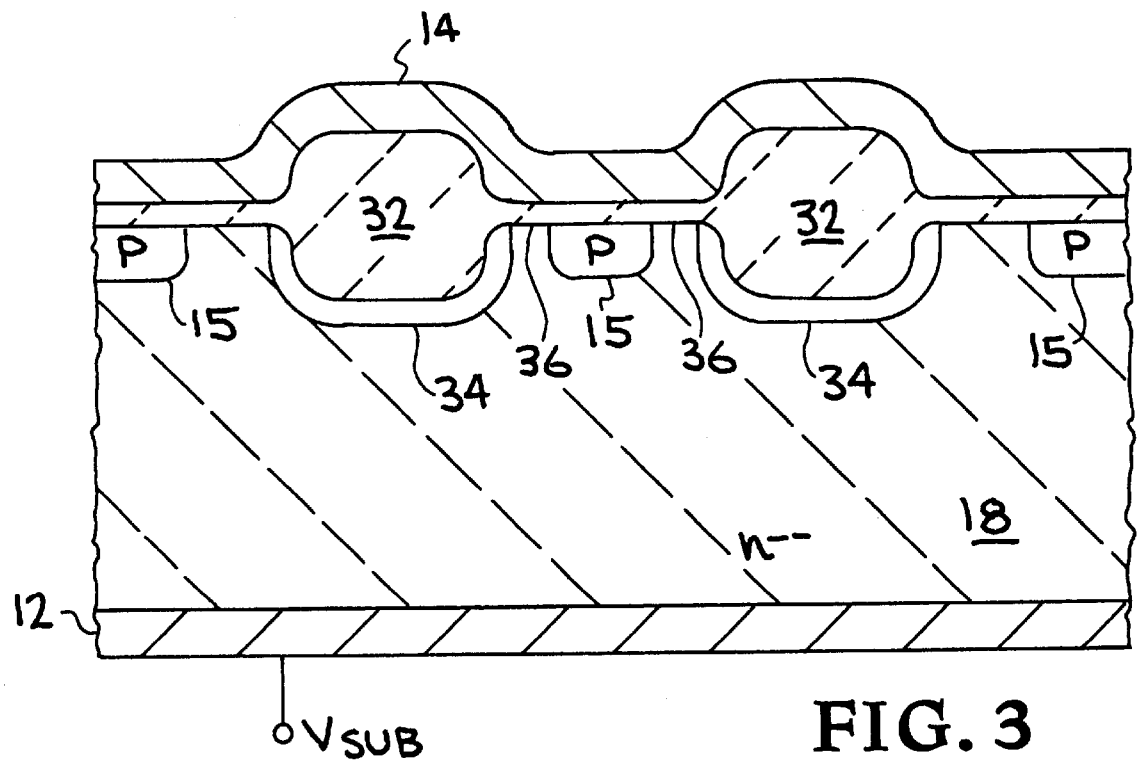
FIG. 3 shows a part of a CCD structure with electrically floating channel stops.

FIG. 3 illustrates several parallel p-channels 15 formed in a substrate 18 with gate electrodes 14 formed over patterned silicon dioxide layer 32. The p-channels are separated by n-type electrically floating channel stop regions 34. Unimplanted high resistivity gaps 36 lie between p-channels 15 and channel stops 34 to drop the voltage from the floating channel stops 34 and prevent electrical breakdown. The floating channel stop regions 34 avoid a large DC current which would occur between the backside bias voltage and grounded channel stops.

Figure 4:
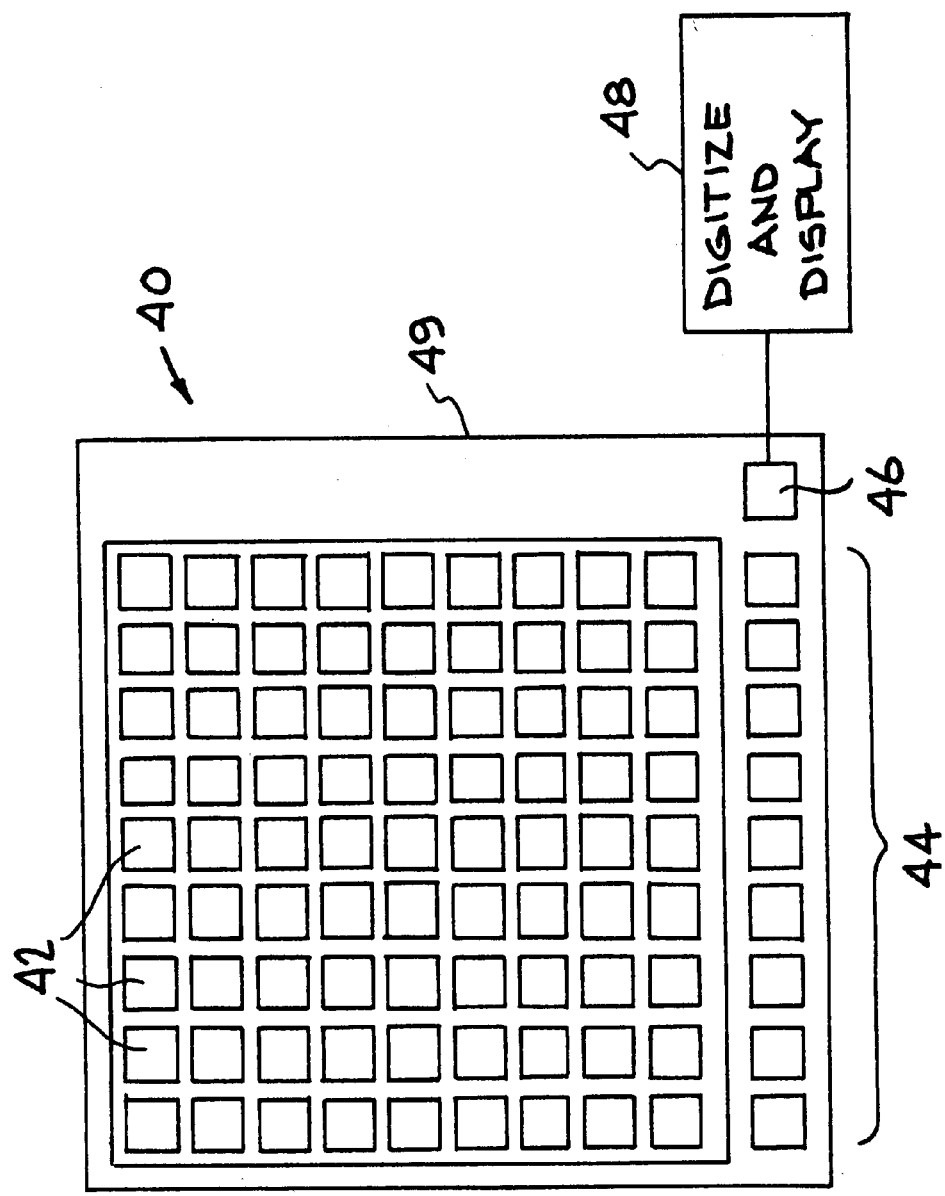
FIG. 4 shows a CCD array imaging system.

As shown in FIG. 4, a CCD array 40 is formed of a plurality of pixels 42, which may be configured as pixels 10 or 30, arranged in rows and columns. Charge collected in p-channels 15 of the CCDs is transferred by applying clocking signals to the electrodes 14 of the CCD circuitry 11 to horizontal register 44 from which the collected charge data is output through output node 46 to computer or other processor 48 which digitize and display the data to produce an image. Output node 46 contains an amplifier and reset. Everything but processor/computer 48 is contained on the CCD chip 49.

An imaging device according to the invention can be formed with different size arrays, e.g. 200×200 pixels or 2048×2048 pixels. Pixels are typically 15 $\mu m^2$. The image detectors are useful for detecting electromagnetic radiation including UV, visible, near IR, and x-rays. Charged particles can also be detected. The image detectors produced from the CCDs of the invention are particularly useful for astronomical imaging.

Changes and modifications in the specifically described embodiments can be carried out without departing from the scope of the invention which is intended to be limited only by the scope of the appended claims.

What is claimed is:

1. A back illuminated fully depleted charge coupled device (CCD) for the detection of electromagnetic radiation and charged particles, comprising:

a substantially thick high resistivity photon sensitive silicon substrate having a frontside and a backside;

a plurality of CCD buried channel regions on the frontside of the substrate, the channels being of opposite conductivity type from the substrate, for collecting signal charge produced in the substrate by incident electromagnetic radiation or charged particles;

CCD gate electrode circuitry patterned on the frontside for transfer of collected signal charge;

CCD amplifier circuitry for detecting the collected signal charge transferred by the gate electrode circuitry;

an electrically conducting ohmic contact layer on the backside of the substrate and having the same conductivity type as the substrate;

a backside bias voltage source connected to the substrate for at least fully depleting the substrate through its entire thickness of charge carriers to create a drift electric field in the volume of the substrate to provide for transport of signal charge carriers produced in the substrate by incident radiation to the buried channel regions.

2. The CCD of claim 1 wherein the backside bias voltage source is electrically connected to the backside ohmic contact layer.

3. The CCD of claim 1 wherein the backside bias voltage source is electrically connected to the frontside of the substrate.

4. The CCD of claim 3 further comprising a frontside voltage contact formed on the frontside of the substrate in an undepleted region, the backside bias voltage source being connected to the frontside voltage contact.

5. The CCD of claim 4 wherein the frontside voltage contact is a ring or a single contact.

6. The CCD of claim 5 further comprising a grounded guard ring positioned over the depleted region between the frontside voltage contact and the CCD gate electrode circuitry.

7. The CCD of claim 6 further comprising a plurality of floating guard rings between the grounded guard ring and the frontside voltage contact.

8. The CCD of claim 1 wherein the substrate is an n-type substrate.

9. The CCD of claim 1 wherein the substrate has a resistivity of about 1 kohm-cm to about 20 kohm-cm.

10. The CCD of claim 1 wherein the substrate has a thickness of about 100 microns to about 1 mm.

11. The CCD of claim 1 wherein the backside conducting layer is formed of phosphorus doped polycrystalline silicon with a thickness of about 10 nm to about 1 micron.

12. The CCD of claim 1 further comprising an antireflection (AR) coating applied to the backside conducting layer.

13. The CCD of claim 12 wherein the AR coating is an insulating coating.

14. The CCD of claim 1 further comprising a computer or other processor connected to the amplifier circuitry for digitizing and displaying the data to produce an image.

15. The CCD of claim 1 further comprising a high resistivity unimplanted region on each side of each channel.

16. The CCD of claim 15 further comprising an electrically floating channel stop on each side of the high resistivity unimplanted regions.

* * * * *